US011028479B2

(12) United States Patent
Yamaguchi et al.

(10) Patent No.: US 11,028,479 B2
(45) Date of Patent: Jun. 8, 2021

(54) METHOD OF FORMING FILM (71) Applicant: TOKYO ELECTRON LIMITED, Tokyo (JP)

(72) Inventors: Katsumasa Yamaguchi, Nirasaki (JP); Takashi Sameshima, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 17 days.

(21) Appl. No.: 16/199,789

(22) Filed: Nov. 26, 2018

(65) Prior Publication Data

US 2019/0161862 A1  May 30, 2019

(30) Foreign Application Priority Data

Nov. 28, 2017  (JP) .............................. JP2017-228352

(51) Int. Cl.
 *C23C 16/08* (2006.01)
 *C23C 16/455* (2006.01)
 (Continued)

(52) U.S. Cl.
 CPC .... *C23C 16/45553* (2013.01); *C23C 16/0272* (2013.01); *C23C 16/045* (2013.01);
 (Continued)

(58) Field of Classification Search
 CPC ........ C23C 16/45525; C23C 16/45527; C23C 16/45553; C23C 16/08; C23C 16/14
 See application file for complete search history.

(56) References Cited

U.S. PATENT DOCUMENTS

| 6,855,368 B1 * | 2/2005 | Kori ..................... C23C 16/0272 |
| | | 427/99.1 |
| 7,964,505 B2 * | 6/2011 | Khandelwal ...... H01L 21/76876 |
| | | 438/680 |

(Continued)

FOREIGN PATENT DOCUMENTS

| JP | 2013-183121 | * 9/2013 | ........... H01L 21/285 |
| JP | 2015-193908 A | 11/2015 | |

(Continued)

OTHER PUBLICATIONS

Lemaire, Paul C., et al., "Thermal Selective Vapor Etching of TiO2: Chemical Vapor Etching via WF6 and Self-Limiting Atomic Layer Etching Using WF6 and BCl3". Chem. Mater. 2017, 29, 6653-6665. DOI: 10.1021/acs.chemmater.7b00985.*

(Continued)

*Primary Examiner* — Bret P Chen
(74) *Attorney, Agent, or Firm* — Nath, Goldberg & Meyer; Jerald L. Meyer (57) ABSTRACT

A method of forming a tungsten film on a surface of a target substrate having a base film is performed by repeating a cycle plural times. The cycle includes alternately supplying a tungsten chloride gas and a reducing gas for reducing the tungsten chloride gas, with a purge interposed therebetween, into a process container in which the target substrate is accommodated and that is maintained under a depressurized atmosphere. The method includes setting a supply flow rate of the tungsten chloride gas and a time of the cycle such that a ratio of a thickness of the base film etched by repeating the cycle the plural times to a thickness of the base film before repeating the cycle the plural times becomes smaller than a predetermined ratio in a state where an integrated flow rate of the tungsten chloride gas per one cycle is kept substantially constant.

5 Claims, 5 Drawing Sheets

(51) Int. Cl.
*C23C 16/14* (2006.01)
*C23C 16/02* (2006.01)
*C23C 16/04* (2006.01)

(52) U.S. Cl.
CPC .............. *C23C 16/08* (2013.01); *C23C 16/14* (2013.01); *C23C 16/45527* (2013.01)

(56) References Cited

U.S. PATENT DOCUMENTS

| | | | | |
|---|---|---|---|---|
| 8,883,637 | B2* | 11/2014 | Jeng ................. | H01L 21/32136 438/672 |
| 9,595,470 | B2* | 3/2017 | Bamnolker ....... | H01L 21/28556 |
| 9,613,818 | B2* | 4/2017 | Ba ..................... | H01L 21/28556 |
| 9,754,824 | B2* | 9/2017 | Schloss ............. | C23C 16/45525 |
| 2003/0013300 | A1* | 1/2003 | Byun ................. | C23C 16/45525 438/680 |
| 2008/0003797 | A1* | 1/2008 | Kim .................. | H01L 21/28568 438/597 |
| 2009/0053893 | A1* | 2/2009 | Khandelwal ...... | C23C 16/45525 438/680 |
| 2010/0093170 | A1* | 4/2010 | Kori .................. | H01L 21/76843 438/680 |
| 2012/0003833 | A1* | 1/2012 | Khandelwal ............ | C23C 16/06 438/680 |
| 2013/0302980 | A1* | 11/2013 | Chandrashekar .......................... | H01L 21/28562 438/666 |
| 2014/0073135 | A1* | 3/2014 | Guan ................ | H01L 21/76861 438/680 |
| 2014/0120723 | A1* | 5/2014 | Fu ...................... | C23C 16/4557 438/680 |
| 2015/0050807 | A1* | 2/2015 | Wu ...................... | C23C 16/045 438/669 |
| 2015/0275367 | A1* | 10/2015 | Moroi ............... | C23C 16/45544 427/255.28 |
| 2015/0325475 | A1* | 11/2015 | Bamnolker ....... | H01L 21/28556 438/680 |
| 2016/0233099 | A1* | 8/2016 | Narushima ............. | C23C 16/14 |
| 2016/0276214 | A1* | 9/2016 | Fu ..................... | H01L 21/76879 |
| 2016/0348234 | A1* | 12/2016 | Suzuki .............. | C23C 16/45527 |
| 2016/0351402 | A1* | 12/2016 | Suzuki ............... | C23C 16/0281 |
| 2017/0040214 | A1* | 2/2017 | Lai .................... | H01L 21/32136 |
| 2018/0240682 | A1* | 8/2018 | Lai .................... | H01L 21/32136 |

FOREIGN PATENT DOCUMENTS

| | | |
|---|---|---|
| JP | 2016-145409 A | 8/2016 |
| JP | 2016-186094 A | 10/2016 |
| JP | 2016-222954 A | 12/2016 |
| JP | 2016-225396 A | 12/2016 |
| KR | 10-2016-0115781 A | 10/2016 |
| WO | 2015/080058 A1 | 6/2015 |

OTHER PUBLICATIONS

Kalanyan, Berc, et al., "Low-Temperature Atomic Layer Deposition of Tungsten using Tungsten Hexafluoride and Highly-diluted Silane in Argon". Chemical Vapor Deposition, 2013, 19, 161-166.*

Lemaire, Paul C., et al., "Understanding inherent substrate selectivity during atomic layer deposition: Effect of surface preparation, hydroxyl density, and metal oxide composition on nucleation mechanisms during tungsten ALD". J. Chem. Phys. 146, 052811 (2017), pp. 1-9.*

Yang, Mengdi, et al., "Comparison of tungsten films grown by CVD and hot-wire assisted atomic layer deposition in a cold-wall reactor". J. Vac. Sci. Technol. A 34(1), Jan./Feb. 2016, 01A129 pp. 1-10. https://doi.Org/10.1116/1.4936387.*

Elam, J.W., et al., "Nucleation and growth during tungsten atomic layer deposition on SiO surfaces". Thin Solid Films 386 (2001), pp. 41-52.*

Mattinen, Miika, et al., "Atomic Layer Deposition of Molybdenum and Tungsten Oxide Thin Films Using Heteroleptic Imido-Amidinato Precursors: Process Development, Film Characterization, and Gas Sensing Properties". Chem. Mater. 2018, 30, pp. 8690-8701.*

Kim, Soo-Hyun, et al., "A Comparative Study of the Atomic-Layer-Deposited Tungsten Thin Films as Nucleation Layers for W-Plug Deposition". Journal of the Electrochemical Society, 153 (10) G887-G893 (2006).*

* cited by examiner

METHOD OF FORMING FILM

CROSS-REFERENCE TO RELATED APPLICATION

This application is based upon and claims the benefit of priority from Japanese Patent Application No. 2017-228352, filed on Nov. 28, 2017, the entire contents of which are incorporated herein by reference.

TECHNICAL FIELD

The present disclosure relates to a method of forming a film and a method of calculating the film formation conditions.

BACKGROUND

In a process of manufacturing a semiconductor device, tungsten is used as a material for filling contact holes or via-holes between wirings, which are formed on a semiconductor wafer.

A tungsten film is formed by, for example, an ALD (Atomic Layer Deposition) method using a tungsten chloride gas and a reducing gas. A tungsten film having good step coverage can be formed in the ALD method as compared with a PVD (Physical Vapor Deposition) method or a CVD (Chemical Vapor Deposition) method.

When the tungsten film is formed by the ALD method, a base film such as a titanium nitride (TiN) film is used from the viewpoint of enhancing the adhesion. However, since the tungsten chloride gas has the property of etching the material constituting, the base film such as the TiN film, the base film may be etched when the tungsten film is formed. In case where the etching amount of the base film is large, there is a possibility that the device characteristics are adversely affected.

As a method for suppressing the etching of the base film, there is a method of decreasing the flow rate of a tungsten chloride gas and there is a method of setting a temperature and a pressure to appropriate conditions so as not to be in the etching mode.

However, neither of the above methods discloses a technique of forming a tungsten film by supplying a tungsten chloride gas at a high flow rate while suppressing the etching of the base film.

SUMMARY

Some embodiments of the present disclosure provide a method of forming a film, which is capable of forming a tungsten film by supplying a tungsten chloride gas at a high flow rate while suppressing etching of a base film.

According to one embodiment of the present disclosure, there is provided a method of forming a tungsten film on a surface of a target substrate having a base film by repeating a cycle plural times, the cycle including alternately supplying a tungsten chloride gas and a reducing gas for reducing the tungsten chloride gas, with a purge interposed therebetween, into a process container in which the target substrate is accommodated and that is maintained under a depressurized atmosphere. The method includes setting a supply flow rate of the tungsten chloride gas and a time of the cycle such that a ratio of a thickness of the base film etched by repeating the cycle the plural times to a thickness of the base film before repeating the cycle the plural times becomes smaller than a predetermined ratio in a state where an integrated flow rate of the tungsten chloride gas per one cycle is kept substantially constant.

According to another embodiment of the present disclosure, there is provided a method of calculating film formation conditions for forming a tungsten film on a surface of a target substrate having a base film by repeating a cycle plural times, the cycle including alternately supplying a tungsten chloride gas and a reducing gas for reducing the tungsten chloride gas, with a purge interposed therebetween, into a process container in which the target substrate is accommodated and that is maintained under a depressurized atmosphere. The method includes setting a supply flow rate of the tungsten chloride gas and a time of the cycle such that a ratio of a thickness of the base film etched by repeating the cycle the plural times to a thickness of the base film before repeating the cycle the plural times becomes smaller than a predetermined ratio in a state where an integrated flow rate of the tungsten chloride gas per one cycle is kept substantially constant.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, modes for carrying out the present disclosure will be described with reference to the drawings. Throughout this specification and the drawings, the same or similar elements and parts are denoted by the same reference numerals, and explanation thereof will not be repeated. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Film-Forming Apparatus]

Figure 1:
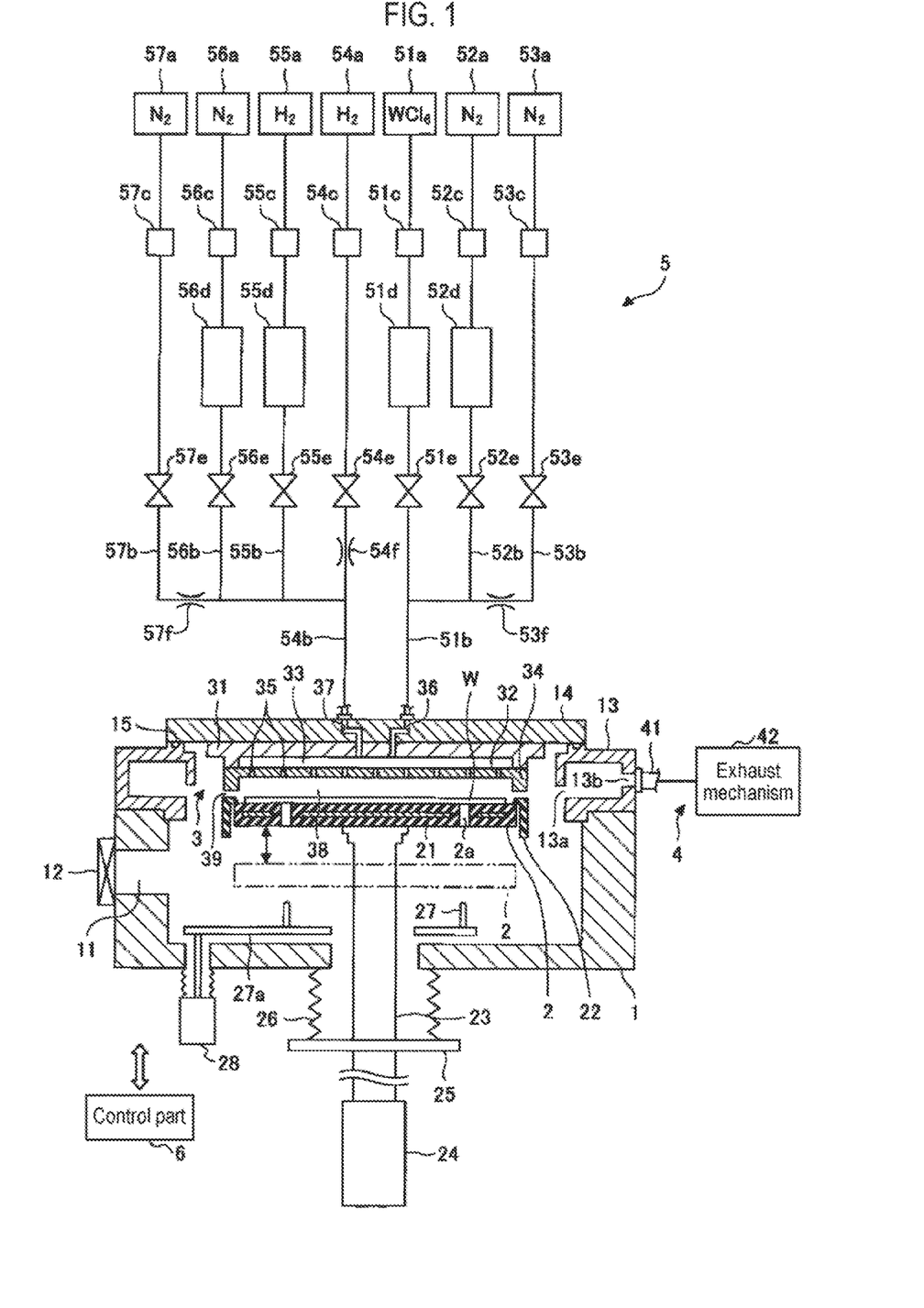
FIG. 1 is a schematic sectional view of a film-forming apparatus according to an embodiment of the present disclosure.

An example of a film-forming apparatus used to carry out a method of forming a tungsten film according to an embodiment of the present disclosure will be described below. FIG. 1 is a schematic sectional view of a film-forming apparatus according to an embodiment of the present disclosure.

The film-forming apparatus includes a process container 1, a mounting table 2, a shower head 3, an exhaust part 4, a gas supply mechanism 5 and a control part 6.

The process container 1 is made of metal such as aluminum and has substantially a cylindrical shape. The process container 1 accommodates a semiconductor wafer (hereinafter referred to as a "wafer W") as a target substrate. A loading/unloading port 11 for loading or unloading the wafer W is formed in the side wall of the process container 1, and the loading/unloading port 11 is opened and closed by a gate valve 12. An annular exhaust duct 13 having a sectional view of a rectangular shape is installed on the main body of the process container 1. A slit 13a is formed in the exhaust duct 13 along its inner circumferential surface. An exhaust port 13b is formed in the outer wall of the exhaust duct 13. A ceiling wall 14 is installed on the upper surface of the exhaust duct 13 so as to close the upper opening of the process container 1. The space between the exhaust duct 13 and the ceiling wall 14 is hermetically sealed with a seal ring 15.

The mounting table 2 horizontally supports the wafer W in the process container 1. The mounting table 2 is formed in a disk shape having a size corresponding to the wafer W and is supported by a support member 23. The mounting table 2 is made of a ceramic material such as aluminum nitride (AlN) or a metal material such as aluminum or nickel alloy and has an internally-buried heater 21 for heating the wafer W. The heater 21 is fed with power from a heater power supply (not shown) to generate heat. Then, the output of the heater 21 is controlled by a temperature signal of a thermocouple (not shown) installed in the vicinity of the upper surface of the mounting table 2, so that the water W is controlled to a predetermined temperature. The mounting table 2 has a cover member 22, which is made of ceramics such as alumina and installed so as to cover the outer peripheral region of the upper surface thereof and the side surface thereof.

The support member 23 for supporting the mounting table 2 is installed on the bottom surface of the mounting table 2. The support member 23 extends from the center of the bottom surface of the mounting table 2 below the process container 1 through a hole formed in the bottom wall of the process container 1 and its lower end is connected to an elevating mechanism 24. The mounting table 2 is moved up/down by the elevating mechanism 24 via the support member 23 between a processing position shown in FIG. 1 and a transfer position indicated by a two-dot chain line below the processing position, at which the wafer W can be transferred. A flange portion 25 is installed on the support member 23 below the process container 1. A bellows 26, which is configured to partition the internal atmosphere of the process container 1 from the air atmosphere and expand/contract in accordance with the moving-up/down of the mounting table 2, is installed between the bottom surface of the process container 1 and the flange portion 25.

Three wafer support pins 27 (only two shown) are installed in the vicinity of the bottom surface of the process container 1 so as to protrude upward from an elevating plate 27a. The wafer support pins 27 ascend and descend via the elevating plate 27a by an elevating mechanism 28 installed below the process container 1. The wafer support pins 27 are inserted in through-holes 2a formed in the mounting table 2 at the transfer position so as to protrude and retract from the upper surface of the mounting table 2. By awning the wafer support pins 27 up and down, the wafer W is delivered between a transfer mechanism (not shown) and the mounting table 2.

The shower head 3 supplies a processing gas in a shower shape into the process container 1. The shower head 3 is made of metal, is installed so as to face the mounting table 2, and has substantially the same diameter as the mounting table 2. The shower head 3 has a main body portion 31 fixed to the ceiling wall 14 of the process container 1 and a shower plate 32 connected below the main body portion 31. A gas diffusion space 33 is formed between the main body portion 31 and the shower plate 32, and gas introduction holes 36 and 37 are formed in the gas diffusion space 33 so as to penetrate the centers of the ceiling wall 14 and the main body portion 31 of the process container 1. An annular protrusion 34 protruding downward is formed in the peripheral edge portion of the shower plate 32. Gas discharge holes 35 are formed in the inner flat surface of the annular protrusion 34. In a state in which the mounting table 2 is at the processing position, a processing space 38 is formed between the mounting table 2 and the shower plate 32, and the top surface of the cover member 22 and the annular protrusion 34 come close to thereby form an annular gap 39.

The exhaust part 4 exhausts the interior of the process container 1. The exhaust part 4 has an exhaust pipe 41 connected to the exhaust port 13b and an exhaust mechanism 42 including a vacuum pump, a pressure control valve and the like, which are connected to the exhaust pipe 41. During the process, a gas in the process container 1 reaches the exhaust duct 13 via the slit 13a and is exhausted from the exhaust duct 13 through the exhaust pipe 41 by the exhaust mechanism 42.

The gas supply mechanism 5 supplies a process gas into the process container 1. The gas supply mechanism 5 includes a $WCl_6$ gas supply source 51a, a $N_2$ gas supply source 52a, a $N_2$ gas supply source 53a, a $H_2$ gas supply source 54a, a $H_2$ gas supply source 55a, a $N_2$ gas supply source 56a and a $N_2$ gas supply source 57a.

The $WCl_6$ gas supply source 51a supplies a $WCl_6$ gas, which is a tungsten chloride gas, into the process container 1 via a gas supply line 51b. A flow rate controller 51c, a storage tank 51d and a valve 51e are installed on the gas supply line 51b from the upstream side. The downstream side of the valve 51e of the gas supply line 51b is connected to the gas introduction hole 36. The $WCl_6$ gas supplied from the $WCl_6$ gas supply source 51a is temporarily stored in the storage tank 51d before being supplied into the process container 1 and is then supplied into the process container 1 after being pressurized to a predetermined pressure in the storage tank 51d. The supply and stop of the $WCl_6$ gas from the storage tank 51d into the process container 1 are performed by the valve 51e. By temporarily storing the $WCl_6$ gas in the storage tank 51d in this manner, the $WCl_6$ gas can be stably supplied into the process container 1 at a relatively high flow rate.

The $N_2$ gas supply source 52a supplies a $N_2$ gas, which is a purge gas, into the process container 1 via a gas supply line 52b. A flow rate controller 52c, a storage tank 52d and a valve 52e are installed on the gas supply line 52b from the upstream side. The downstream side of the valve 52e of the gas supply line 52b is connected to the gas supply line 51b. The gas supplied from the $N_2$ gas supply source 52a is temporarily stored in the storage tank 52d before being supplied into the process container 1 and is then supplied into the process container 1 after being pressurized to a predetermined pressure in the storage tank 52d. The supply and stop of the $N_2$ gas from the storage tank 52d into the process container 1 are performed by the valve 52e. By temporarily storing the $N_2$ gas in the storage tank 52d in this manner, the $N_2$ gas can be stably supplied into the process container 1 at a relatively high flow rate.

The $N_2$ gas supply source 53a supplies a $N_2$ gas, which is a carrier gas, into the process container 1 via a gas supply line 53b. A flow rate controller 53c, a valve 53e and an orifice 53f are installed on the gas supply line 53b from the upstream side. The downstream side of the orifice 53f of the gas supply line 53b is connected to the gas supply line 51b. The $N_2$ gas supplied from the $N_2$ gas supply source 53a is continuously supplied into the process container 1 during the film formation of the wafer W. The supply and stop of the $N_2$ gas from the $N_2$ gas supply source 53a into the process container 1 are performed by the valve 53e. Although a gas is supplied to the gas supply lines 51b and 52b at a relatively high flow rate by the storage tanks 51d and 52d, the gas supplied to the gas supply lines 51b and 52b is prevented from flowing back to the $N_2$ gas supply line 53b by the orifice 53f.

The $H_2$ gas supply source 54a supplies a $H_2$ gas, which is a reducing gas, into the process container 1 via a gas supply line 54b. A flow rate controller 54c, a valve 54e and an orifice 54f are installed on the gas supply line 54b from the upstream side. The downstream side of the orifice 54f of the gas supply line 54b is connected to the gas introduction hole 37. The $H_2$ gas supplied from the $H_2$ gas supply source 54a is continuously supplied into the process container 1 during the film formation of the wafer W. The supply and stop of the $H_2$ gas from the $H_2$ gas supply source 54a into the process container 1 are performed by the valve 54e. Although a gas is supplied to gas supply lines 55b and 56b at a relatively high flow rate by storage tanks 55d and 56d, the gas supplied to the gas supply lines 55b and 56b is prevented from flowing back to the $N_2$ gas supply line 54b by the orifice 54f.

The $H_2$ gas supply source 55a supplies a $H_2$ gas, which is a reducing gas, into the process container 1 via a gas supply line 55b. A flow rate controller 55c, the storage tank 55d and a valve 55e are installed on the gas supply line 55b from the upstream side. The downstream side of the valve 55e of the gas supply line 55b is connected to the gas supply line 54b. The $H_2$ gas supplied from the $H_2$ gas supply source 55a is temporarily stored in the storage tank 55d before being supplied into the process container 1 and is then supplied into the process container 1 after being pressurized to a predetermined pressure in the storage tank 55d. The supply and stop of the $H_2$ gas from the storage tank 55d into the process container 1 are performed by the valve 55e. By temporarily storing the $H_2$ gas in the storage tank 55d in this manner, the $H_2$ gas can be stably supplied into the process container 1 at a relatively high flow rate.

The $N_2$ gas supply source 56a supplies a $N_2$ gas, winch is a purge gas, into the process container 1 via a gas supply line 56b. A flow rate controller 56c, a storage tank 56d and a valve 56e are installed on the gas, supply line 56b from the upstream side. The downstream side of the valve 56e of the gas supply line 56b is connected to the gas supply line 54b. The $N_2$ gas supplied from the $N_2$ gas supply source 56a is temporarily stored in the storage tank 56d before being supplied into the process container 1 and is then supplied into the process container 1 after being pressurized to a predetermined pressure in the storage tank 56d. The supply and stop of the $N_2$ gas from the storage tank 56d into the process container 1 are performed by the valve 56e. By temporarily storing the $N_2$ gas in the storage tank 56d in this manner, the $N_2$ gas can be stably supplied into the process container 1 at a relatively high flow rate.

The $N_2$ gas supply source 57a supplies a $N_2$ gas, which is a carrier gas, into the process container 1 via a gas supply line 57b. A flow rate controller 57c, a valve 57e and an orifice 57f are installed on the gas supply line 57b from the upstream side. The downstream side of the orifice 57f of the gas supply line 57b is connected to the gas supply line 54b. The $N_2$ gas supplied from the $N_2$ gas supply source 57a is continuously supplied into the process container 1 during the film formation of the wafer W. The supply and stop of the $N_2$ gas from the $N_2$ gas supply source 57a into the process container 1 are performed by the valve 57e. Although a gas is supplied to the gas supply lines 55b and 56b at a relatively high flow rate by the storage tanks 55d and 56d, the gas supplied to the gas supply lines 55b and 56b is prevented from flowing back to the $N_2$ gas supply line 57b by the orifice 57f.

The control part 6 is, for example, a computer and includes a CPU (Central Processing Unit), a RAM (Random Access Memory), a ROM (Read Only Memory), an auxiliary storage device and the like. The CPU operates based on a program stored in the ROM or the auxiliary storage device to control the overall operation of the film-forming apparatus. The control part 6 may be installed inside or outside the filer-forming apparatus. In the case where the control part 6 is installed outside the film-forming apparatus, the control part 6 can control the film-forming apparatus by means of wired or wireless communications.

[Film-Forming Method]

Figure 2:
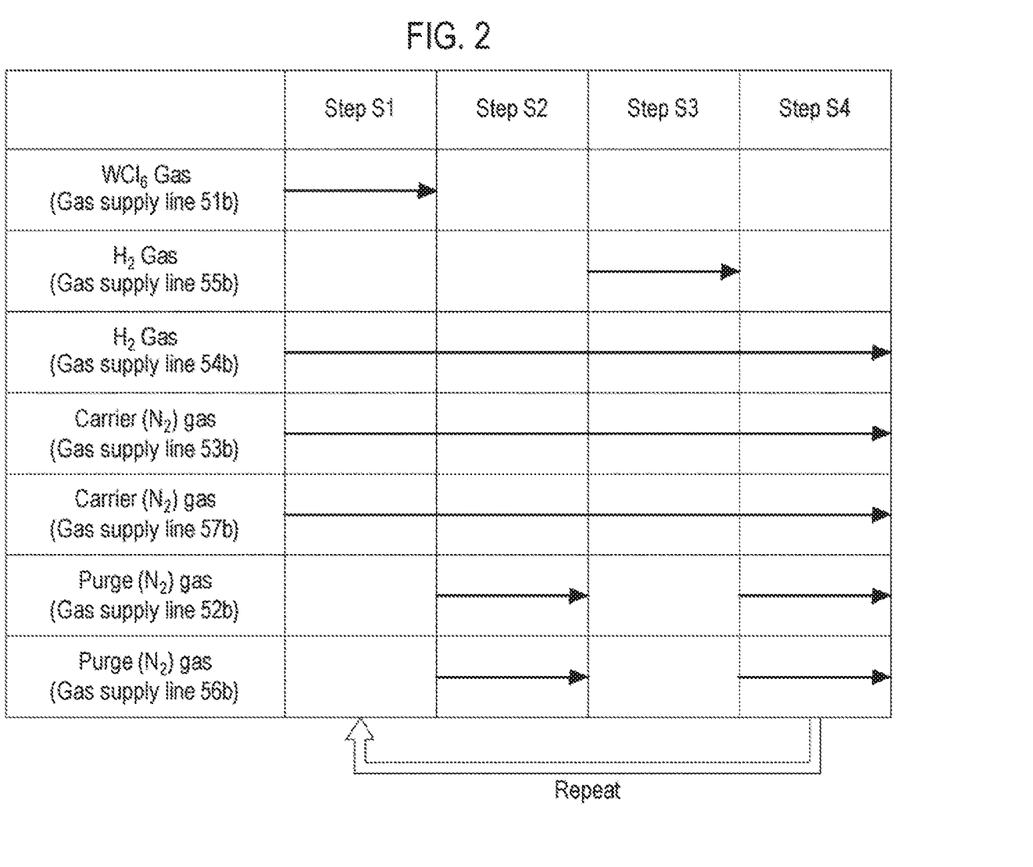
FIG. 2 is a diagram showing a gas supply sequence of a film-forming method according to an embodiment of the present disclosure.

A method of forming a tungsten film using the above-described film-forming apparatus will now be described. The film-forming method according to an embodiment of the present disclosure is applied to a case where a titanium nitride (TiN) film serving as a base film is formed on the surface of a silicon film having a recess such as a trench or a hole by an ALD (Atomic Layer Deposition) method. FIG. 2 is a view showing a gas supply sequence of the film-forming method according to the embodiment of the present disclosure.

First, with the valves 51e to 57e closed, the gate valve 12 is opened and the wafer W is transferred into the process container 1 by the transfer mechanism and is mounted on the mounting table 2 at the transfer position. After the transfer mechanism is retracted from the interior of the process container 1, the gate valve 12 is closed. The wafer W is heated to a predetermined temperature (for example, 450 to 650 degrees C.) by the heater 21 of the mounting table 2 and the mounting table 2 is raised to the processing position to form the processing space 38. Further, the interior of the process container 1 is adjusted to a predetermined pressure (for example, $1.3 \times 10^3$ to $8.0 \times 10^3$ Pa) by the pressure control valve of the exhaust mechanism 42.

Next, the valves 53e and 57e are opened and a carrier gas ($N_2$ gas) is supplied at a predetermined flow rate for example, 100 to 3,000 sccm) from the $N_2$ gas supply sources 53a and 57a to the gas supply lines 53b and 57b, respectively. In addition, the valve 54e is opened and a $H_2$ gas is supplied at a predetermined flow rate (for example, 500 to 8,000 sccm) from the $H_2$ gas supply source 54a to the gas supply line 54b. Further, a $WCl_6$ gas and a $H_2$ gas are supplied from the $WCl_6$ gas supply source 51a and the $H_2$ gas supply source 55a to the gas supply lines 51b and 55b, respectively. At this time, since the valves 51e and 55e are closed, the $WCl_6$ gas and the $H_2$ gas are respectively stored in the storage tanks 51d and 55d to raise the internal pressure of the storage tanks 51d and 55d.

Next, the valve 51e is opened and the $WCl_6$ gas stored in the storage tank 51d is supplied into the process container 1 and is adsorbed onto the surface of the wafer W (step S1). In parallel with the supply of the $WCl_6$ gas into the process container 1, a purge gas ($N_2$ gas) is supplied from the $N_2$ gas supply sources 52a and 56a, to the gas supply lines 52b and 56b, respectively. At this time, as the valves 52e and 56e are closed, the purge gas is stored in the storage tanks 52d and 56d to raise the internal pressure of the storage tanks 52d and 56d.

After a predetermined time (for example, 0.05 to 5 seconds) elapses after the valve 51e is opened, the valve 51e is closed and the valves 52e and 56e are opened to stop the supply of the $WCl_6$ gas into the process container 1 and to supply the purge gas stored in the storage tanks 52d and 56d into the process container 1 (step S2). At this time, since the purge gas is supplied from the storage tanks 52d and 56d with their raised internal pressure, the purge gas is supplied into the process container 1 at a relatively high flow rate, for example, a flow rate (for example, 500 to 10,000 sccm) larger than the flow rate of the carrier gas. Therefore, the $WCl_6$ gas remaining in the process container 1 is promptly discharged to the exhaust pipe 41 to replace the internal $WCl_6$ gas atmosphere of the process container 1 with an atmosphere containing the $H_2$ gas and the $N_2$ gas in a short time. On the other hand, as the valve 51e is closed, the $WCl_6$ gas supplied from the $WCl_6$ gas supply source 51a to the gas supply line 51b is stored in the storage tank lid to raise the internal pressure of the storage tank 51d.

After a predetermined time (for example, 0.05 to 5 seconds) elapses after the valves 52e and 56e are opened, the valves 52e and 56e are closed and the valve 55e is opened to stop the supply of the purge gas into the process container 1 and supply the gas stored in the storage tank 55d into the process container 1 to reduce the $WCl_6$ gas adsorbed on the surface of the wafer W (step S3). At this time, as the valves 52e and 56e are closed, the purge gases supplied from the gas supply sources 52a and 56a to the gas supply lines 52b and 56b, respectively, are stored in the storage tanks 52d and 56d to raise the internal pressure of the storage tanks 52d and 56d.

After a predetermined time (for example, 0.05 to 5 seconds) elapses after the valve 55e is opened, the valve 55e is closed and the valves 52e and 56e are opened to stop the supply of the gas into the process container 1 and to supply the purge gas stored in the storage tanks 52d and 56d into the process container 1 (step S4). At this time, since the purge gas is supplied from the storage tanks 52d and 56d with their raised internal pressure, the purge gas is supplied into the process container 1 at a relatively high flow rate, for example, a flow rate (for example, 500 to 10,000 sccm) larger than the flow rate of the carrier gas. Therefore, the $H_2$ gas remaining in the process container 1 is promptly discharged to the exhaust pipe 41 to replace the internal $H_2$ gas atmosphere of the process container 1 with an atmosphere containing the $H_2$ gas and the gas in a short time. On the other hand, as the valve 55e is closed, the $H_2$ gas supplied from the $H_2$ gas supply source 55a to the gas supply line 55b is stored in the storage tank 55d to raise the internal pressure of the storage tank 55d.

By performing one cycle of the above steps S1 to S4, a thin tungsten unit film is formed on the surface of the TiN film. Then, by repeating the cycle of the steps S1 to S4 a predetermined number of times (for example, 50 to 1,000 cycles), a tungsten film having a desired film thickness is formed. Thereafter, the wafer W is unloaded from the process container 1 in a procedure that is the reverse of that at the time of loading the wafer W into the process container 1.

At this time, in a state where the integrated flow rate (exposure amount) of $WCl_6$ gas per cycle is kept substantially constant, the supply flow rate of $WCl_6$ gas and the time of one cycle are set so that the ratio of the thickness of the TiN film etched by repeating the cycle the plural times to the thickness of the TiN film before repeating the cycle the plural times (hereinafter referred to as an "etching ratio") is smaller than a predetermined ratio. The predetermined ratio is for example, 50%, specifically 25%, more specifically 10%, from the viewpoint that the function (for example, adhesion) of the TiN film as the base film can be secured sufficiently and the tungsten film can be formed at a high density.

[Effects]

In the case of forming the tungsten film by the ALD method using the $WCl_6$ gas and the $H_2$ gas, the adsorption of the $WCl_6$ gas and the reduction of the $WCl_6$ gas by the $H_2$ gas are repeated to form the tungsten film. At this time. $WCl_6$ hydrogen chloride (HCl), chlorine ($Cl_2$) and the like are generated as by-products. $WCl_x$ HCl and $Cl_2$ generated as by-products have the property of etching the TiN film. Therefore, if $WCl_x$, HCl and $Cl_2$ are present in the process container 1, the TiN film may be etched. In addition, as the time during which $WCl_x$, HCl and $Cl_2$ stay in the process container 1 becomes longer (the residence probability becomes larger), the etching amount of the TiN film becomes larger.

In the film-forming method according to the embodiment of the present disclosure, in a state where the integrated flow rate (exposure amount) of $WCl_6$ gas per cycle is kept substantially constant, the supply flow rate of $WCl_6$ gas and the time of one cycle are set so that the ratio of the thickness of the TiN film etched by repeating the cycle the plural times to the thickness of the TiN film before repeating the cycle the plural times is smaller than a predetermined ratio. Thus, while securing the integrated flow rate of the $WCl_6$ gas per one cycle required to form the tungsten unit film, the time of one cycle can be shortened within a range where the etching ratio of the TiN film becomes smaller than the predetermined ratio. Therefore, since $WCl_x$, HCl and $Cl_2$ can be quickly exhausted from the process container 1 to the exhaust pipe 41, the time during which. WCl, HCl, and $Cl_2$ stay in the process container 1 becomes shorter (the residence probability becomes smaller). As a result, the etching amount of the TiN film becomes smaller. Therefore, according to the film-forming method of the embodiment of the present disclosure, it is possible to form a tungsten film by supplying a $WCl_6$ gas at a high flow rate while suppressing etching of the TiN film in addition, since the time of one cycle can be shortened, the productivity is improved.

In addition, in the film-forming method according to the embodiment of the present disclosure, the cycle of alternately supplying the tungsten chloride gas and the $H_2$ gas, with the purge interposed therebetween, into the process container 1, which is maintained under the depressurized atmosphere, is repeated a predetermined number of times to form a tungsten film on the surface of the wafer W. Thereby, a tungsten film having good step coverage can be formed.

Further, in the film-forming method according to the embodiment of the present disclosure, the $WCl_6$ gas is discharged from the process container 1 by supplying the $N_2$ gas temporarily stored in the storage tanks 52d and 36d, as the purge gas, into the process container 1. Therefore, the $WCl_6$ gas remaining in the process container 1 is promptly discharged to the exhaust pipe 41 to replace the internal $WCl_6$ gas atmosphere of the process container 1 with an atmosphere containing the $H_2$ gas and the $N_2$ gas in a short time. As a result, the time required to form the tungsten film can be shortened.

[Film-Forming Apparatus According to First Modification]

Figure 3:
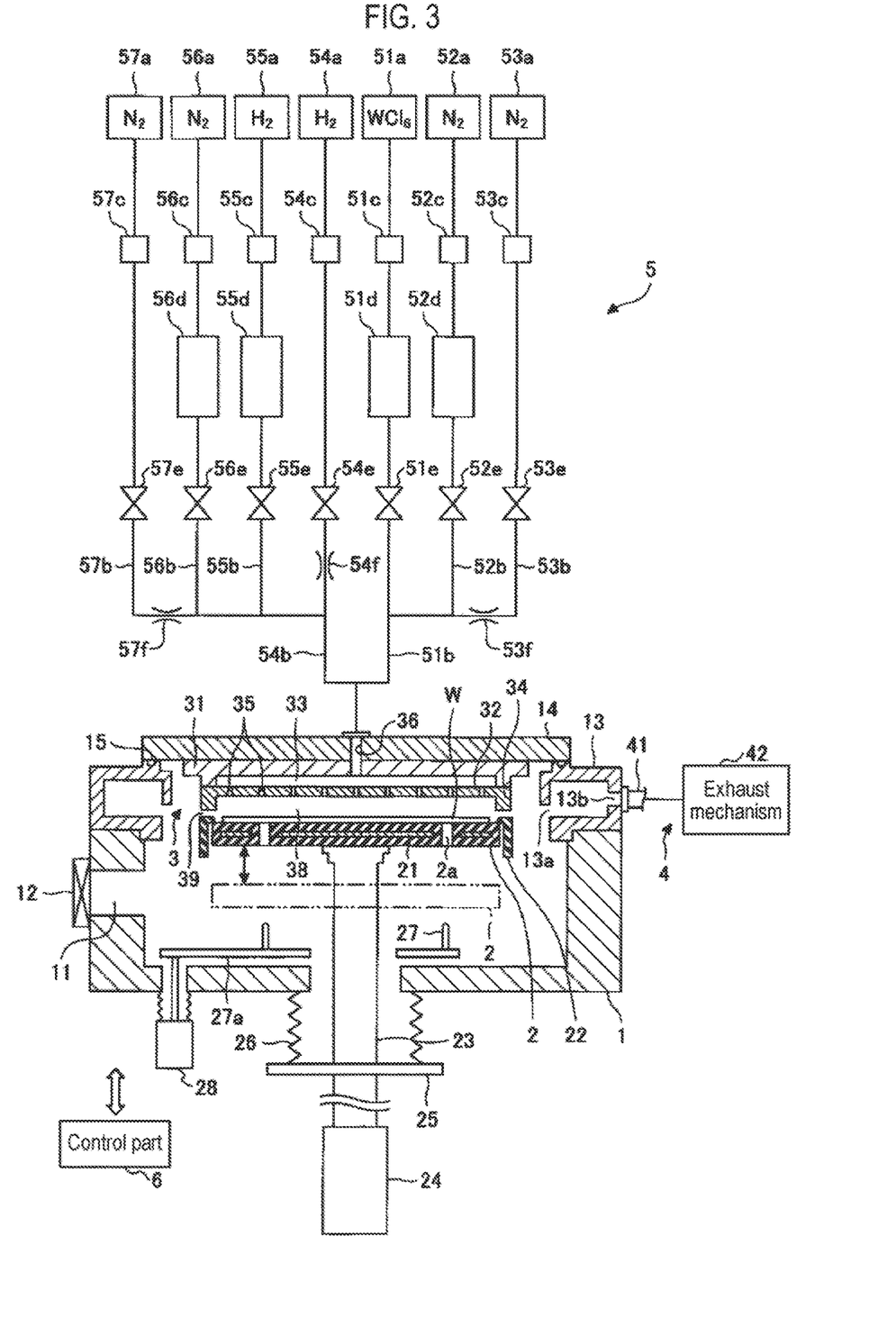
FIG. 3 is a schematic sectional view of a film-forming apparatus according to a first modification of the embodiment of the present disclosure.

A film-forming apparatus according to a first modification of the embodiment of the present disclosure will now be described. FIG. 3 is a schematic sectional view of a film-forming apparatus according to a first modification of the embodiment of the present disclosure.

As shown in FIG. 3, in the film-forming apparatus according to the first modification, after the gas supply line 54b is connected to the gas supply line 51b, it communicates to the gas diffusion space 33 via the gas introduction hole 36. As a result, a gas supplied from the gas supply line 51b and a gas supplied from the gas supply line 54b are mixed before reaching the gas diffusion space 33.

Even in the case of using the film-forming apparatus according to the first modification, as in the case of using the film-forming apparatus shown in FIG. 1, it is possible to form a tungsten film by supplying a tungsten chloride gas at a high flow rate while suppressing etching of the TiN film.

[Film-Forming Apparatus According to Second Modification]

Figure 4:
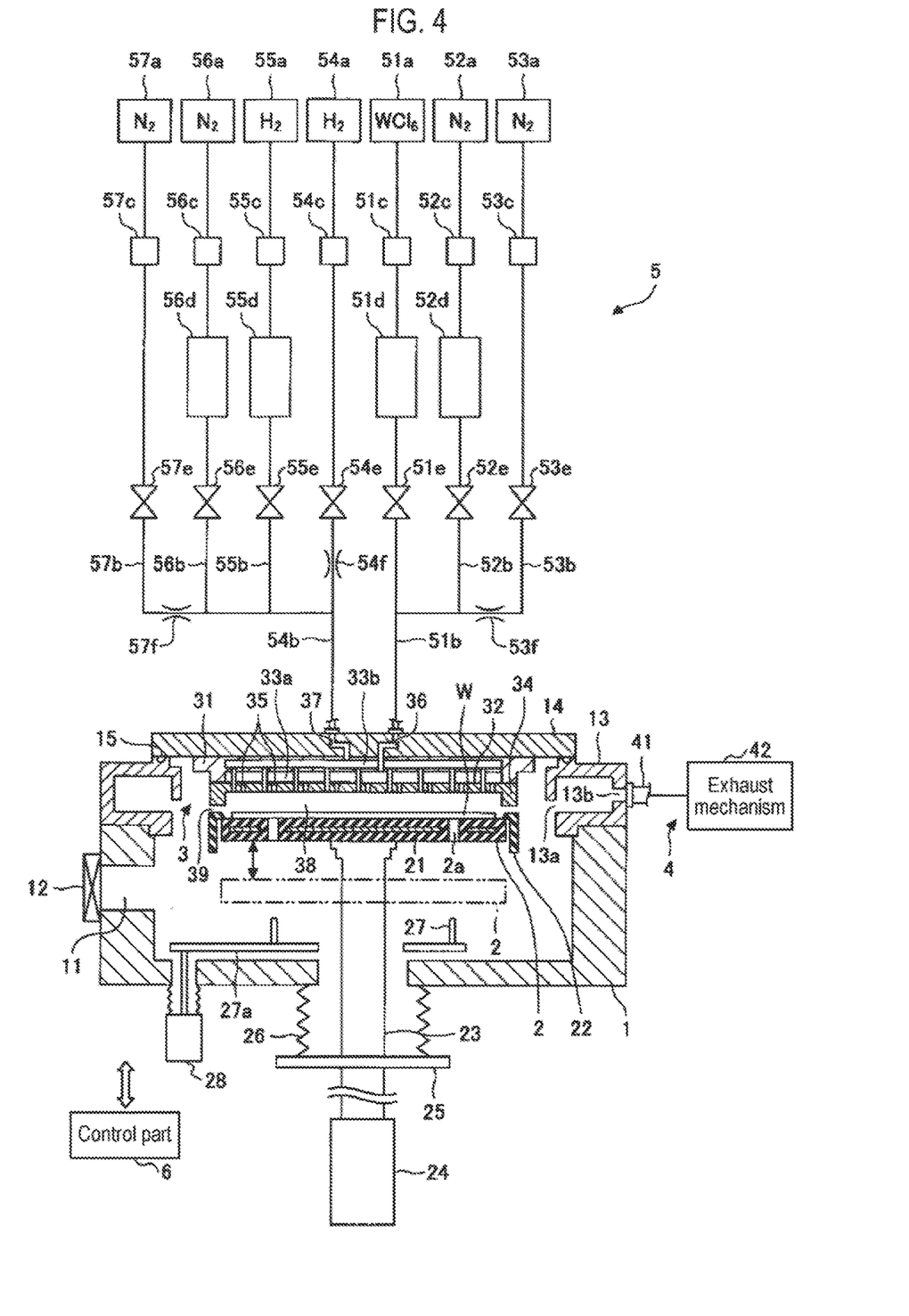
FIG. 4 is a schematic sectional view of a film-forming apparatus according to a second modification of the embodiment of the present disclosure.

A film-forming apparatus according to a second modification of the embodiment of the present disclosure will now be described. FIG. 4 is a schematic sectional view of a film-forming apparatus according to a second modification of the embodiment of the present disclosure.

As shown in FIG. 4, in the film-forming apparatus according to the second modification, the gas supply lines 51b and 54b communicate to different gas diffusion spaces 33a and 33b via the gas introduction holes 36 and 37, respectively. As a result, a gas supplied from the gas supply line 51b and a gas supplied from the gas supply line 54b are mixed in the processing space 38.

Even in the case of using the film-forming apparatus according to the second modification, as in the case of using the film-forming apparatus shown in FIG. 1, it is possible to form a tungsten film by supplying a tungsten chloride gas at a high flow rate while suppressing etching of the TiN film.

EXAMPLES

Example 1

The film-forming apparatus shown in FIG. 1 was used to form a tungsten film on a TiN film (film thickness: 5.0 nm) as a base film under different film formation conditions (conditions 1, 2 and 3) using the above-described film-forming method, and then the etching amount of the TiN film for each of the conditions 1, 2 and 3 was evaluated. The film formation conditions are as shown in Table 1 below.

TABLE 1

|  | Condition 1 | Condition 2 | Condition 3 |
|---|---|---|---|
| Temp. (° C.) |  | 400~650 |  |
| Pressure (Pa) |  | 10~60 |  |
| GAP (mm) |  | 1~20 |  |
| WCl$_x$ (mg/min) | 50~600 | ↑ | ↓ |
| Counter Purge N$_2$ (A) (sccm) |  | 100~3000 |  |
| Counter Purge N$_2$ (B) (sccm) |  | 100~3000 |  |
| FLASH Purge N$_2$ (A) (sccm) | 500~10000 | ↑ | ↓ |
| FLASH Purge N$_2$ (B) (sccm) | 500~10000 | ↑ | ↓ |
| H$_2$ (sccm) |  | 1000~8000 |  |
| Time (sec) WCl$_x$ | 0.05~5 | ↓ | ↑ |
| Purge after W |  | 0.05~5 |  |
| H$_2$ |  | 0.05~5 |  |
| Purge after H |  | 0.05~5 |  |
| Total Time/cycle (sec) | 0.2~20 | ↓ | ↑ |
| WCl$_x$ exposure (mg/cy) |  | 1~10 |  |

In Table 1, "Temp." represents the wafer temperature (degrees C.), "Pressure" represents the internal pressure (Pa) of the process container 1, and "GAP" represents the distance (mm) between the upper surface of the mounting table 2 and the lower surface of the shower head 3. "WCl$_x$" represents the supply flow rate (mg/min) of WCl$_x$ gas supplied from the gas supply line 51b into the process container 1. "Counter Purge N$_2$(A)" represents the supply flow rate (sccm) of N$_2$ gas, which is a carrier gas, supplied from the gas supply line 53b into the process container 1. "Counter Purge N$_2$(B)" represents the supply flow rate (sccm) of N$_2$ gas, which is a carrier gas, supplied from the gas supply line 57b into the process container 1. "FLASH Purge N$_2$(A)" represents the supply flow rate (sccm) of N$_2$ gas, which is a purge gas, supplied from the gas supply line 52b into the process container 1. "FLASH Purge N$_2$(B)" represents the supply flow rate (sccm) of N$_2$ gas, which is a purge gas, supplied from the gas supply line 56b into the process container 1. "H$_2$" represents the supply flow rate (sccm) of H$_2$ gas supplied from the gas supply line 55b into the process container 1. "Time WCl$_x$", "Time Purge after W", "Time H$_2$" and "Time Purge after H" represent the time (sec) in steps S1, S2, S3 and S4, respectively. "Total Time/cycle" represents the total time (sec) from step S1 to step S4, that is, the time (see) of one cycle. "WCl$_x$ exposure" represents the integrated flow rate (mg/cy) of WCl$_x$ gas per one cycle and is a value calculated according to the following equation (1).

$$\text{Integrated flow rate of WCl}_x \text{ gas} = \text{supply flow rate of WCl}_x \text{ gas} \times \text{time of one cycle} \quad (1)$$

In addition, in Table 1, "↑" represents that the supply flow rate is large or the time is long with respect to the condition 1, and "↓" represents that the supply flow rate is small or the time is short with respect to the condition 1.

The condition 1 is a condition in which the supply flow rate of WCl$_x$ gas is set to 50 to 600 mg/min and the time of one cycle is set to 0.2 to 20 sec.

The condition 2 is a condition in which the flow rate of WCl$_x$ gas is increased and the time of one cycle is decreased in a state where the integrated flow rate of WCl$_x$ gas per one cycle is maintained substantially constant with respect to the condition 1.

The condition 3 is a condition in which the supply flow rate of WCl$_x$ gas is decreased and the time of one cycle is increased in a state where the integrated flow rate of WCl$_x$ gas per one cycle is maintained substantially constant with respect to the condition 1.

Figure 5:
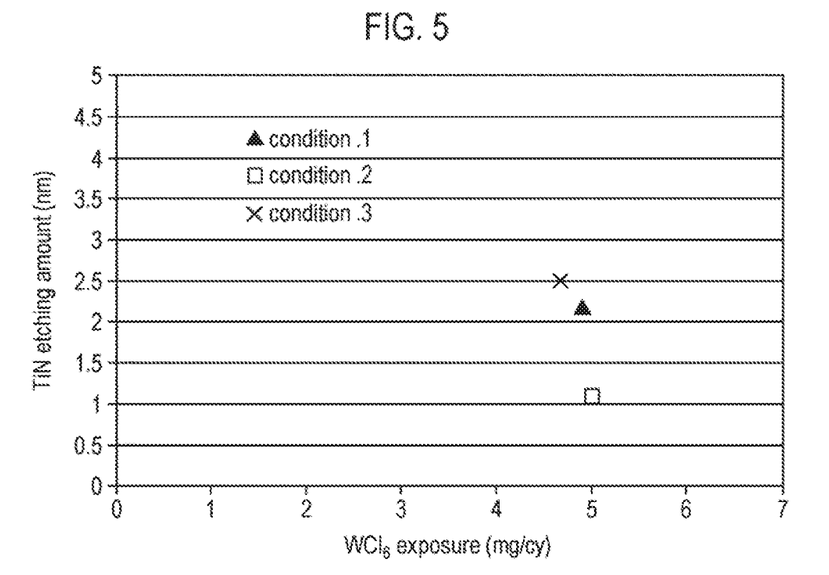
FIG. 5 is a graph showing the relationship between the film formation conditions of a tungsten film and the etching amount of a TiN film.

FIG. 5 is a graph showing the relationship between the film formation conditions of a tungsten film and the etching amount of a TiN film. In the graph of FIG. 5, the horizontal axis represents the integrated flow rate (mg/cy) of WCl$_6$ gas per one cycle, and the vertical axis represents the etching amount (nm) of TiN film.

As an example, FIG. 5 shows the etching amount of TiN film under the conditions 1 to 3 when a WCl$_6$ gas is used as the WCl$_x$ gas and the integrated flow rate of WCl$_6$ gas per one cycle is adjusted to about 5 mg/cy.

In the case of the condition 1, the etching amount of TiN film when a tungsten film was formed on the TiN film having the film thickness of 5.0 nm was 2.2 nm. In other words, in the case of the condition 1, the etching ratio of TiN film due to the formation of the tungsten film was 44%.

In the case of the condition 2, the etching amount of TiN film when a tungsten film was formed on the TiN film having the film thickness of 5.0 nm was 1.1 nm. In other words, in the case of the condition 2, the etching ratio of TiN film due to the formation of the tungsten film was 22%.

In the case of the condition 3, the etching amount of TiN film when a tungsten film was formed on the TiN film having the film thickness of 5.0 nm was 2.5 nm. In other words, in the case of the condition 3, the etching ratio of TiN film due to the formation of the tungsten film was 50%.

It can be seen from these results shown in FIG. 5 that the etching amount of TiN film can be controlled by adjusting the supply flow rate of $WCl_6$ gas and the time of one cycle in a state where the integrated flow rate of $WCl_6$ gas per one cycle is maintained substantially constant. It can be also seen that the etching amount of TiN film can be decreased by increasing the supply flow rate of $WCl_6$ gas and decreasing the time of one cycle in a state where the integrated flow rate of $WCl_6$ gas per one cycle is maintained substantially constant.

Further, in either of the conditions 1 and 2, no significant difference was observed in the in-plane distribution of the etching amount of TiN film.

Example 2

The film-forming apparatus shown in FIG. 1 was used to form a tungsten film on a TiN film as a base film formed on the surface of a recess under different film formation conditions (conditions 1, 2 and 3) using the above-described film-forming method, and then the characteristics of burial of the tungsten film in the recess for each of the conditions 1, 2 and 3 were evaluated. The film formation conditions are as shown in the above-described Table 1.

In all the conditions 1 to 3, no significant difference was observed in the characteristics of burial of the tungsten film in the recess. It is conceivable from these results that the influence on the characteristics of burial of the tungsten film in the recess due to adjustment of the supply flow rate of $WCl_6$ gas and the time of one cycle in a state where the integrated flow rate of $WCl_6$ gas per one cycle is maintained substantially constant is small.

Although the embodiments for carrying out the present disclosure have been described above, the present disclosure is not limited to the above embodiments but various modifications and improvements can be made within the spirit and scope of the present disclosure.

For example, while the case where the tungsten chloride gas is the $WCl_6$ gas has been illustrated in the above embodiments, the present disclosure is not limited thereto but the tungsten chloride gas may be, for example, a $WCl_5$ gas or a $WCl_4$ gas.

In addition, while the case where the reducing gas is the $H_2$ gas has been illustrated in the above embodiments, the present disclosure is not limited thereto but the reducing gas may be, for example, a $SiH_4$ gas, a $B_2H_6$ gas or an $NH_3$ gas.

In addition, while the case where the purge gas and the carrier gas are the $N_2$ gas has been illustrated in the above embodiments, the present disclosure is not limited thereto but these gases may be, for example, an Ar gas.

In addition, while the case where the base film is the TiN film has been illustrated in the above embodiments, the present disclosure is not limited thereto but the base film may be, for example, a TiSiN film.

Further, while the case where the target substrate is the semiconductor wafer has been illustrated in the above embodiments, the present disclosure is not limited thereto. For example, the target substrate may be a glass substrate used for FPD (Flat Panel Display) such as a liquid crystal display device, a ceramic substrate or the like.

According to the present disclosure in some embodiments, it is possible to form a tungsten film by supplying a tungsten chloride gas at a high flow rate while suppressing etching of a base film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a tungsten film on a surface of a target substrate having a base film by repeating a cycle plural times, the cycle including alternately supplying a tungsten chloride gas and a reducing gas for reducing the tungsten chloride gas, with a purge interposed therebetween, into a process container in which the target substrate is accommodated and that is maintained under a depressurized atmosphere, the method comprising:

setting an integrated flow rate of the tungsten chloride gas per one cycle to be substantially constant while the tungsten film is formed on the target substrate; and     shortening a time of the cycle while increasing a supply flow rate of the tungsten chloride gas within a range where a ratio of a thickness of the base film etched by repeating the cycle the plural times to a thickness of the base film before repeating the cycle the plural times becomes smaller than a predetermined ratio, in a state where the integrated flow rate of the tungsten chloride gas per one cycle is kept substantially constant.

2. The method of claim 1, wherein the predetermined ratio is 50%.

3. The method of claim 1, wherein the tungsten chloride gas is one selected from the group consisting of a $WCl_6$ gas, a $WCl_5$ gas and a $WCl_4$ gas.

4. The method of claim 1, wherein the reducing gas is at least one selected from the group consisting of a $H_2$ gas, a $SiH_4$ gas, a $B_2H_6$ gas and an $NH_3$ gas.

5. The method of claim 1, wherein the base film is one selected from the group consisting of a TiN film and a TiSiN film.

* * * * *